(12) United States Patent
Isokawa

(10) Patent No.: US 6,847,116 B2
(45) Date of Patent: Jan. 25, 2005

(54) CHIP-TYPE SEMICONDUCTOR LIGHT-EMITTING DEVICE

(75) Inventor: Shinji Isokawa, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/731,889

(22) Filed: Dec. 7, 2000

(65) Prior Publication Data
US 2001/0040239 A1 Nov. 15, 2001

(30) Foreign Application Priority Data
Dec. 8, 1999 (JP) .......................................... 11-348648

(51) Int. Cl.[7] .............................................. H01L 23/48
(52) U.S. Cl. ...................... 257/736; 257/673; 257/690; 257/748; 257/775; 257/781; 257/784; 257/787
(58) Field of Search ................................. 257/736, 748, 257/750, 766, 762, 775, 784

(56) References Cited

U.S. PATENT DOCUMENTS

| | | | | |
|---|---|---|---|---|
| 3,935,501 A | * | 1/1976 | Sterbal ........................ | 313/499 |
| 5,227,662 A | * | 7/1993 | Ohno et al. ................. | 257/676 |
| 5,936,264 A | * | 8/1999 | Ishinaga ....................... | 257/99 |
| 6,066,861 A | * | 5/2000 | Hohn et al. .................... | 257/99 |
| 6,180,962 B1 | * | 1/2001 | Ishinaga ....................... | 257/99 |
| 6,228,676 B1 | * | 5/2001 | Glenn et al. ................. | 438/107 |

* cited by examiner

*Primary Examiner*—Long Pham
*Assistant Examiner*—Wai-Sing Louie
(74) *Attorney, Agent, or Firm*—Gerald T. Bodner

(57) ABSTRACT

A chip-type semiconductor light-emitting device includes a semiconductor light-emitting chip connected to a pair of electrodes formed on a substrate. The semiconductor light-emitting chip is molded, together with respective parts of the electrodes, by resin. The electrode has a layered structure having a Cu layer, an Ni layer and an Au layer in that order from the lowermost layer, to have a step formed inside the mold by changing the wall thickness of the Cu layer.

8 Claims, 3 Drawing Sheets

FIG2. B

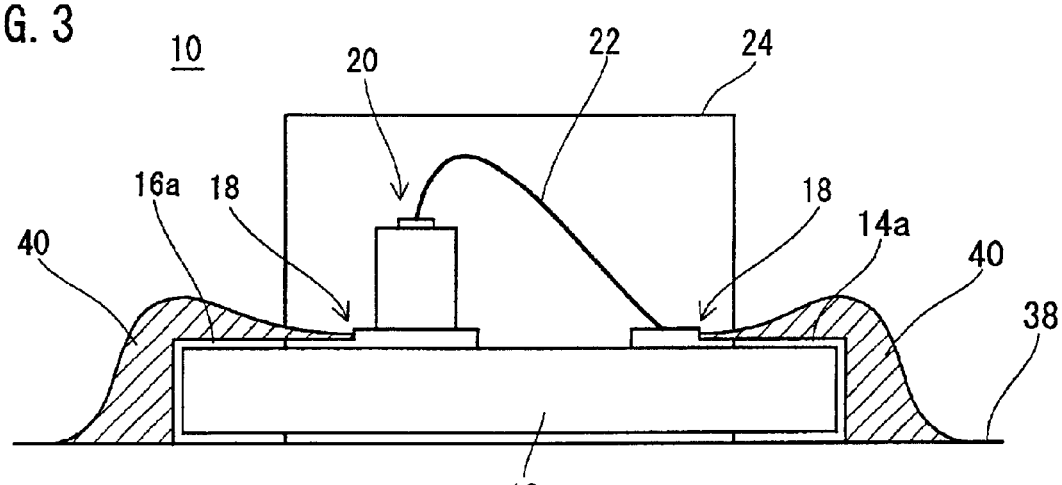
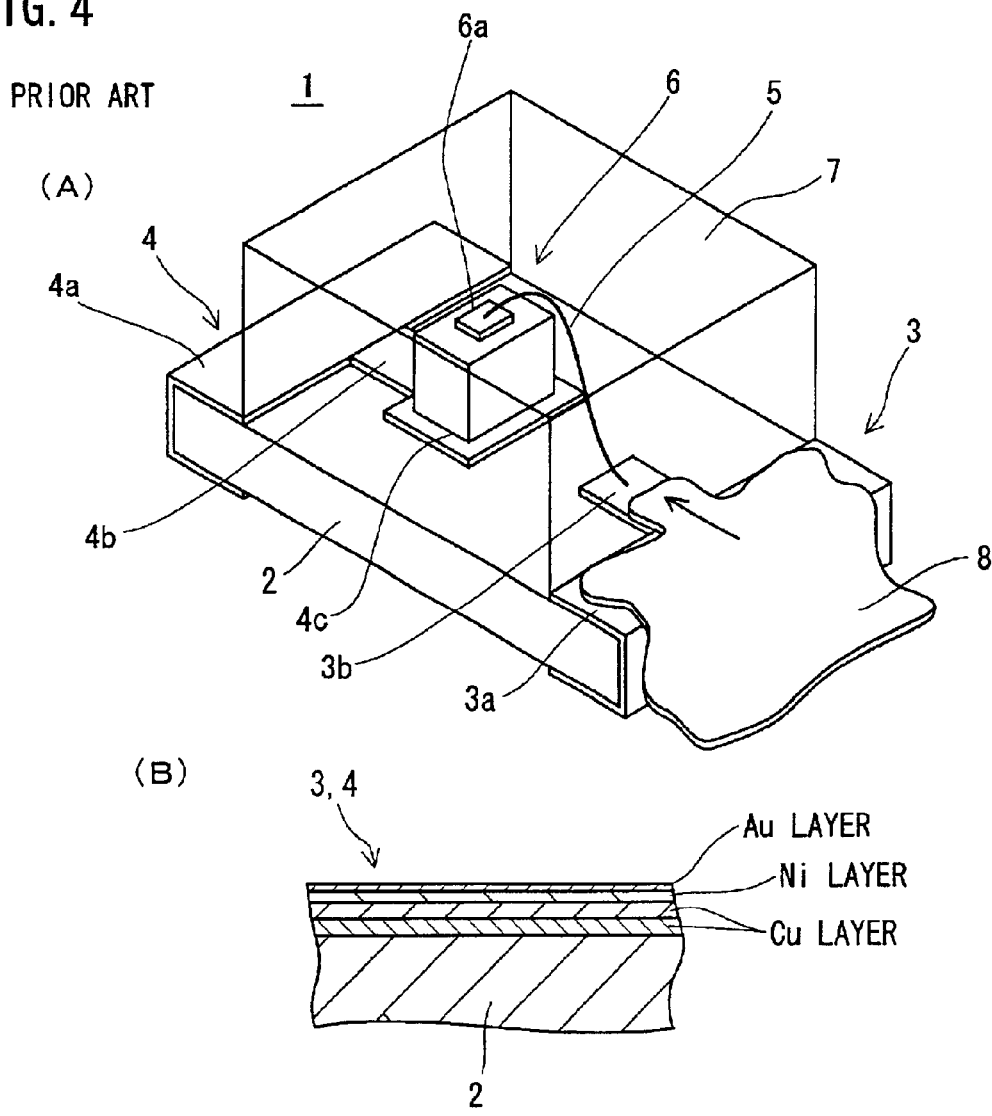

CHIP-TYPE SEMICONDUCTOR LIGHT-EMITTING DEVICE

BACKGROUND OF THE INVENTION

1. Field of the Invention

This invention relates to chip-type semiconductor light-emitting devices and, more particularly, to a chip-type semiconductor light-emitting device having a semiconductor light-emitting chip connected to an electrode on a substrate and molded together with part of the electrode.

2. Description of the Prior Art

A conventional chip-type semiconductor light-emitting device of this kind is shown in FIG. 4. This chip-type semiconductor light-emitting device 1 includes a substrate 2. At opposite ends of the substrate 2, a pair of electrodes 3 and 4 are formed. The electrodes 3 and 4 include respective terminals 3a and 4a. Each of the terminals 3a and 4a is formed, at its width center, with a protrusion 3b, 4b. Also, a pad 4c is formed at a tip of one protrusion 4b. The electrodes 3 and 4 are structured by three layers, i.e. a Cu (copper) layer, an Ni (nickel) layer and an Au (gold) layer, as shown in FIG. 4(B). The formation of an Au layer, as an uppermost layer, improves the adhesion with solder and electrical connection to a metal wire 5.

The semiconductor light-emitting chip (hereinafter referred merely to as "LED chip") 6 is bonded on the pad 4c in the electrode 4. The LED chip 6 at a back electrode is electrically connected with the electrode 4. Wire bonding is made using the metal wire 5 between a surface electrode 6a on the LED chip 6 and the protrusion 3b in the electrode 3. Furthermore, the protrusion 3b, the protrusion 4b, the pad 4c, the metal wire 5, the LED chip 6, etc. are encapsulated by a translucent synthetic resin mold 7. Such chip-type semiconductor light-emitting device 1 is to be mounted in a state that the backside of the substrate 2 is in contact with a surface of a circuit board. In the reflow process, electrical connection is provided through solder 8 between the terminals 3a and 4a and the wiring pattern on the circuit board.

In the prior art, there is a fear that, when repeatedly conducting a reflow process, solder melt 8 possibly intrudes into the mold 7 via the protrusions 3b and 4b, possibly reaching the metal wire 5 or the LED chip 6. If the solder 8 reaches the metal wire 5 or the LED chip 6, they might be stripped off or damaged due to the impact caused upon such reach of solder, resulting in erroneous operation of the chip-type semiconductor light-emitting device 1.

SUMMARY OF THE INVENTION

Therefore, it is a primary object of the present invention to provide a chip-type semiconductor light-emitting device capable of preventing peeling off of parts within the mold due to solder.

A chip-type semiconductor light-emitting device according to the present invention, comprises: a substrate; a pair of electrodes formed on the substrate; a semiconductor light-emitting chip electrically connected to the pair of electrodes; a mold encapsulating respective parts of the semiconductor light-emitting chip and the pair of electrodes; and a step formed in the electrodes at an inside of the mold and having a height increasing from an outer side to an inner side thereof.

If the solder melted during a reflow process intrudes into the mold via the electrode surfaces, the solder runs against a wall of the step made high with respect to a direction of from an outer side to an inner side. That is, the solder intruded in the mold is blocked before reaching the metal wire or the LED chip.

According to this invention, because the solder is blocked from advancing by the step, the parts inside the mold can be prevented from stripped off or so due to the solder.

The above described objects and other objects, features, aspects and advantages of the present invention will become more apparent from the following detailed description of the present invention when taken in conjunction with the accompanying drawings.

BRIEF DESCRIPTION OF THE DRAWINGS

FIG. 2A–FIG. 2D are an illustrative view showing a method for forming a step in the FIG. 1 embodiment;

FIG. 3 is an illustrative view showing a state that solder is blocked from intruding in the FIG. 1 embodiment; and FIG. 4 is an illustrative view showing a prior art.

DETAILED DESCRIPTION OF THE PREFERRED EMBODIMENTS

Figure 1A:
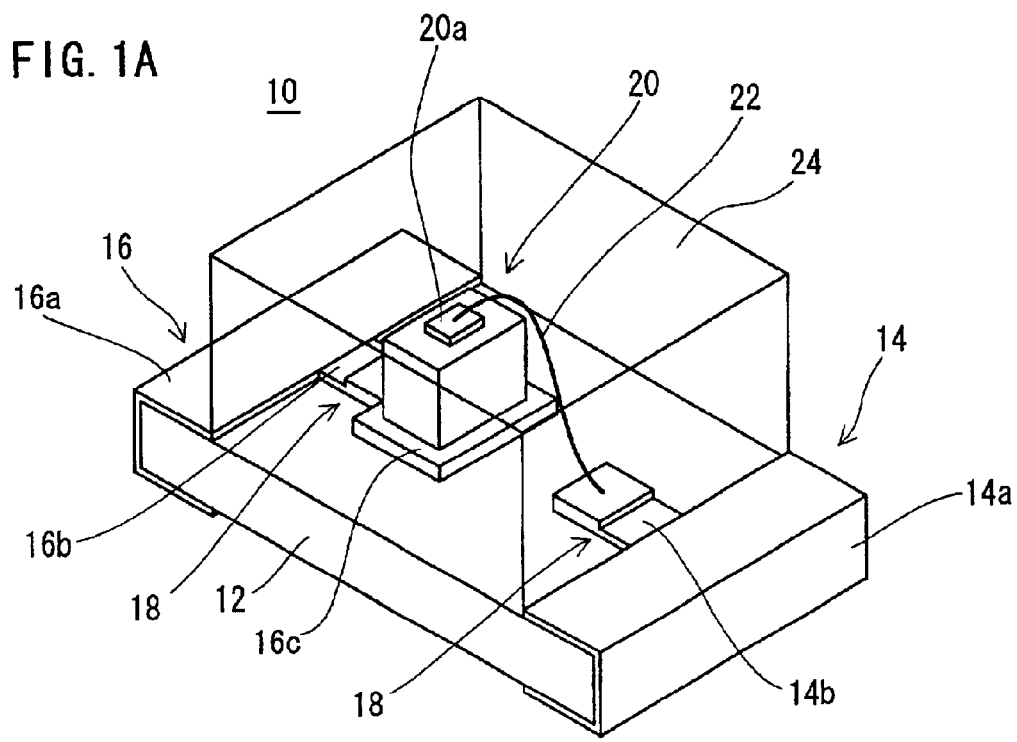
FIG. 1A–FIG. 1C are an illustrative view showing one embodiment of the present invention.
Figure 1B:
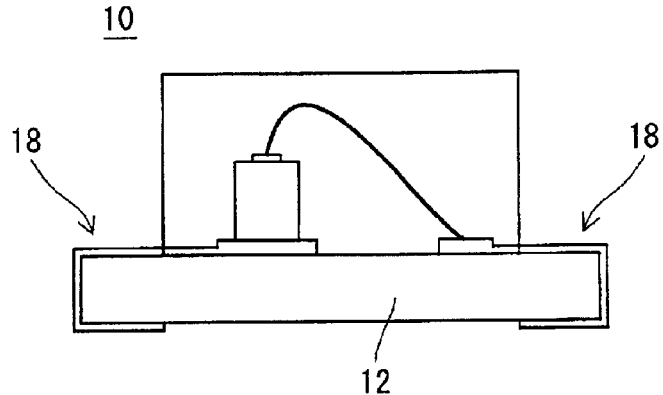
Figure 1C:
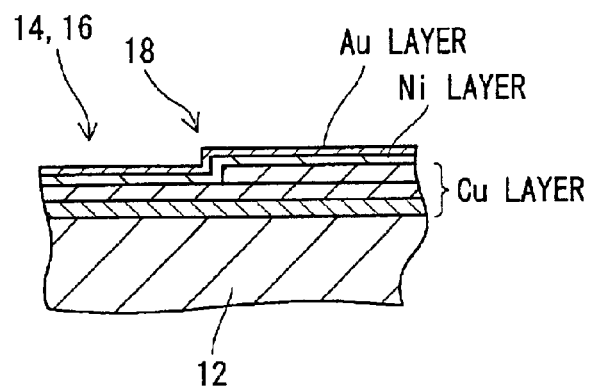

A chip-type semiconductor light-emitting device 10 of this embodiment shown in FIG. 1A–FIG. 1C is suited for lighting, etc. in portable electronic appliances, such as cellular phones, PHSs and the like, and includes an insulating substrate 12. The substrate 12 is formed of a BT resin or the like based on a glass cloth moistened with a heat-resisting BT resin and has a small size (length×width×height), e.g. nearly 2.0 mm×1.25 mm×0.8 mm or nearly 1.6 mm×0.8 mm×0.8 mm in order to meet the recent size-reduction requirement. Incidentally, the light-emitting device 10 is to be obtained by forming a multiplicity of elements in a matrix form on a substrate 12 having a size of nearly 10 cm×5 cm and then being cut.

A pair of electrodes 14 and 16 are formed at opposite ends of the substrate 12. The electrodes 14 and 16 include respective terminals 14a and 16a formed extending between the lower and upper surfaces of the substrate 12. The terminals 14a and 16a are formed with respective protrusions 14b and 16b extending from a widthwise center thereof. The protrusions 14b and 16b have respective steps each formed in the full width at a lengthwise center portion thereof. The step provides a height greater at an outer portion (on a terminal side) and smaller at an inner portion (on a substrate center side). A pad 16c is formed in a tip of one protrusion 16b. Incidentally, each of the electrodes 14 and 16 comprises three layers, i.e. a Cu layer, an Ni layer and an Au layer, as shown in FIG. 1C. The step 18 is formed by providing the Cu-layer with a greater thickness at the inner portion (substrate center side) and a smaller thickness at the outer portion (terminal side). The provision of the uppermost Au layer is for improving the adhesion of solder 40 and electrical connection to the metal wire 22.

The LED chip 20 is bonded on the pad 16c to have electrical connection at a backside electrode thereof with the electrode 16. Also, wire bonding is made by the use of a metal wire 22, such as a gold wire, between the surface electrode 20a of the LED chip 20 and the protrusion 14b of the electrode 14.

Furthermore, a translucent-synthetic-resin mold 24 is formed on the upper surface of the substrate 12. The mold encapsulates the protrusion 14b, protrusion 16b, pad 16c, LED chip 20 and metal wire 22.

Hereunder, explanation will be made on a method for forming respective steps in the electrodes 14 and 16, with reference to FIG. 2A–FIG. 2D.

Figure 2A:
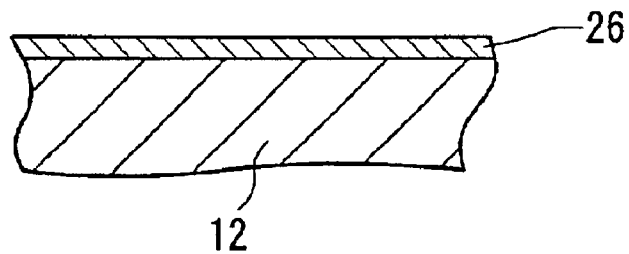
Figure 2A:
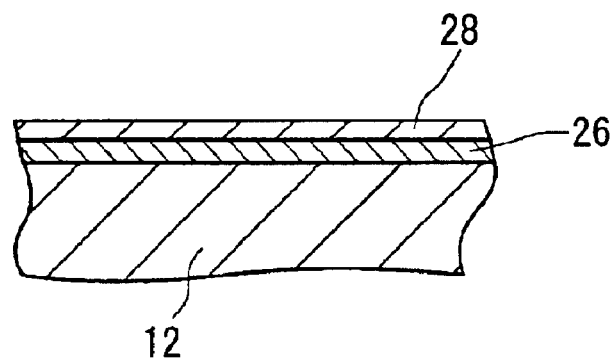

At first, as shown in FIG. 2A, prepared is a substrate 12 having, on a surface, a Cu foil having a predetermined thickness (approximately 16–20 μm). The Cu foil is etched into a predetermined pattern 26.

Figure 2C:
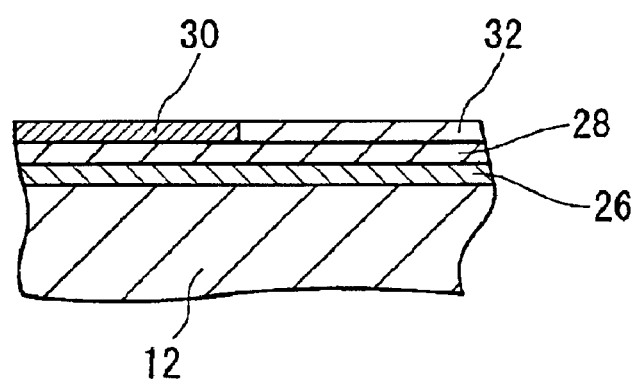
Figure 2D:
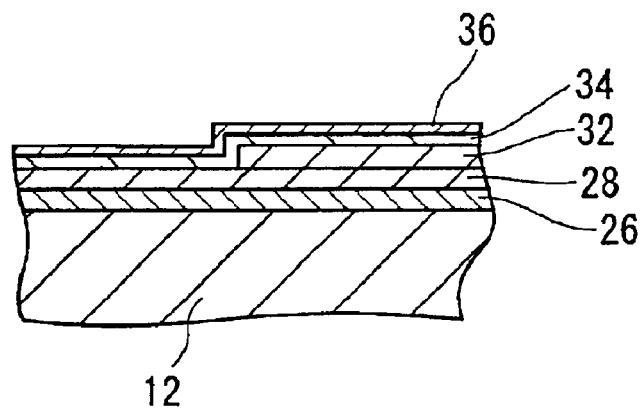

Next, as shown in FIG. 2D, a first Cu layer 28 is formed by conducting electroplating to a predetermined thickness (approximately 10 μm) on the surface of the pattern 26.

Subsequently, as shown in FIG. 2C, resist 30 is applied onto a portion toward this with respect to the step 18. A second Cu layer 32 is formed by conducting electroplating to a predetermined thickness (approximately 10 μm) on the first Cu layer 28.

As shown in FIG. 2D, after the resist 30 is removed away, an Ni layer 34 and an Au layer 36 are formed in the order by conducting electroplating on the first Cu layer 28 and second Cu layer 32. Herein, the thickness of the Ni layer 34 is set at approximately 5–10 μm, while the thickness of the Au layer 36 is at approximately 0.3–0.5 μm.

In this manner, the step 18 is formed by increasing the thickness of the Cu layer at the inner portion than that of the outer portion.

The light-emitting device 10 is mounted in a state that the substrate 12 is directly placed on the surface of a circuit board 38, as shown in FIG. 3. In the reflow process, electrical connection is provided through solder 40 between the terminals 14a and 16a and the wiring pattern on the circuit board 38. In the reflow process, even if solder melt 40 intrude into the mold 24 via the surfaces of the electrode 14 and 16, the solder 40 runs against a wall of the step 18 and blocked from flowing further inside.

According to this embodiment, because the step 18 serves to block solder 40 from advancing furthermore, the parts (LED chip 20, metal wire 22, etc.) inside the mold can be prevented from being stripped off due to the solder 40. Accordingly, the light-emitting device 10 is prevented from erroneously operating.

Incidentally, although in the embodiment the Cu layer, the Ni layer and the Au layer are formed by electroplating, these layers may be formed by electroless plating (chemical plating). Also, in this case, a barrier layer, such as Pd (palladium) layer, may be formed between the Ni layer and the Au layer.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A chip-type semiconductor light-emitting device, comprising:

a pair of electrodes, at least one of said pair of electrodes including an inner portion and an outer portion, the inner portion of the at least one of said pair of electrodes residing in the same plane as the outer portion of the at least one of said pair of electrodes;

a semiconductor light-emitting chip electrically connected to said pair of electrodes;

a mold encapsulating said semiconductor light-emitting chip, said mold encapsulating said inner portion of at least one of said pair of electrodes, said outer portion of at least one of said pair of electrodes extending substantially laterally beyond said mold; and a step formed in said inner portion of at least one of said pair of electrodes at an inside of said mold, and extending transversely and entirely across the at least one of said pair of electrodes, said step having a height increasing from an outer side to an inner side of said mold.

2. A chip-type semiconductor light-emitting device according to claim 1, wherein said electrode includes a Cu layer, said step being formed by changing a thickness of said Cu layer.

3. A chip-type semiconductor light-emitting device according to claim 1, wherein said electrode includes an Au layer formed in an uppermost layer thereof.

4. A chip-type semiconductor light-emitting device according to claim 2, wherein said electrode includes an Au layer formed in an uppermost layer thereof.

5. A chip-type semiconductor light-emitting device according to claim 1, wherein said step is formed by only a metal layer.

6. A chip-type semiconductor light-emitting device according to claim 2, wherein said step is formed by only a metal layer.

7. A chip-type semiconductor light-emitting device according to claim 3, wherein said step is formed by only a metal layer.

8. A chip-type semiconductor light-emitting device according to claim 4, wherein said step is formed by only a metal layer.

* * * * *